(12) United States Patent
Kawashima et al.

(10) Patent No.: US 11,107,746 B2
(45) Date of Patent: Aug. 31, 2021

(54) POWER SEMICONDUCTOR APPARATUS AND MANUFACTURING METHOD THEREFOR

(71) Applicant: Mitsubishi Electric Corporation, Tokyo (JP)

(72) Inventors: Hiroshi Kawashima, Tokyo (JP); Takamasa Iwai, Tokyo (JP); Taketoshi Shikano, Tokyo (JP); Satoshi Kondo, Tokyo (JP); Ken Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 215 days.

(21) Appl. No.: 15/763,232

(22) PCT Filed: Feb. 9, 2016

(86) PCT No.: PCT/JP2016/053808
§ 371 (c)(1),
(2) Date: Mar. 26, 2018

(87) PCT Pub. No.: WO2017/138092
PCT Pub. Date: Aug. 17, 2017

(65) Prior Publication Data
US 2019/0057928 A1    Feb. 21, 2019

(51) Int. Cl.
*H01L 21/56*    (2006.01)
*H01L 23/31*    (2006.01)
(Continued)

(52) U.S. Cl.
CPC ............ *H01L 23/42* (2013.01); *H01L 21/565* (2013.01); *H01L 23/3107* (2013.01);
(Continued)

(58) Field of Classification Search
CPC .............. H01L 21/565; H01L 23/3135; H01L 24/3107; H01L 23/3121; H01L 23/32;
(Continued)

(56) References Cited

U.S. PATENT DOCUMENTS 5,309,027 A * 5/1994 Letterman, Jr. ....... H01L 21/565
257/666
5,641,997 A   6/1997 Ohta et al.
(Continued)

FOREIGN PATENT DOCUMENTS

CN    104795337 A    7/2015
JP    H01-268159 A   10/1989
(Continued)

OTHER PUBLICATIONS

Machine Translation of JP 2015-135907. (Year: 2020).*
(Continued)

*Primary Examiner* — Mary A Wilczewski
(74) *Attorney, Agent, or Firm* — Studebaker & Brackett PC

(57) ABSTRACT

A lead frame (4) includes an inner lead (5), an outer lead (2) connected to the inner lead (5), and a power die pad (7). A power semiconductor device (9) is bonded onto the power die pad (7). A first metal thin line (11) electrically connects the inner lead (5) and the power semiconductor device (9). Sealing resin (1) seals the inner lead (5), the power die pad (7), the power semiconductor device (9), and the first metal thin line (11). The sealing resin (1) includes an insulating section (15) directly beneath the power die pad (7). A thickness of the insulating section (15) is 1 to 4 times a maximum particle diameter of inorganic particles in the sealing resin (1). A first hollow (14) is provided on an upper surface of the sealing resin (1) directly above the power die (Continued)

pad (7) in a region without the first metal thin line (11) and the power semiconductor device (9).

19 Claims, 15 Drawing Sheets

(51) Int. Cl.
| | |
|---|---|
| H01L 23/42 | (2006.01) |
| H01L 23/495 | (2006.01) |
| H01L 25/16 | (2006.01) |
| H01L 25/065 | (2006.01) |
| H01L 23/373 | (2006.01) |
| H01L 23/433 | (2006.01) |
| H01L 23/00 | (2006.01) |
| H01L 25/00 | (2006.01) |

(52) U.S. Cl.
CPC ...... *H01L 23/3121* (2013.01); *H01L 23/3135* (2013.01); *H01L 23/3737* (2013.01); *H01L 23/4334* (2013.01); *H01L 23/49503* (2013.01); *H01L 23/49541* (2013.01); *H01L 23/49551* (2013.01); *H01L 23/49575* (2013.01); *H01L 24/32* (2013.01); *H01L 24/83* (2013.01); *H01L 25/065* (2013.01); *H01L 25/16* (2013.01); *H01L 25/50* (2013.01); *H01L 24/48* (2013.01); *H01L 24/73* (2013.01); *H01L 2224/32245* (2013.01); *H01L 2224/48091* (2013.01); *H01L 2224/48106* (2013.01); *H01L 2224/48137* (2013.01); *H01L 2224/48245* (2013.01); *H01L 2224/48247* (2013.01); *H01L 2224/73265* (2013.01); *H01L 2224/92247* (2013.01); *H01L 2924/1203* (2013.01); *H01L 2924/13055* (2013.01); *H01L 2924/13091* (2013.01); *H01L 2924/181* (2013.01); *H01L 2924/1815* (2013.01)

(58) Field of Classification Search
CPC . H01L 23/3737; H01L 23/42; H01L 23/4334; H01L 23/49503; H01L 23/49551; H01L 23/49575; H01L 23/3107; H01L 25/065; H01L 25/16; H01L 25/50; H01L 2924/1203; H01L 2924/13055; H01L 2924/13091; H01L 2924/181; H01L 2924/1815; H01L 24/32; H01L 24/48; H01L 24/73; H01L 24/83; H01L 2224/32245; H01L 2224/48091; H01L 2224/48137; H01L 2224/48245; H01L 2224/48247; H01L 2224/73265; H01L 2224/92247
See application file for complete search history.

(56) References Cited

U.S. PATENT DOCUMENTS

| | | | | | |
|---|---|---|---|---|---|
| 5,814,878 | A * | 9/1998 | Hirakawa | ............. | H01L 21/565 257/667 |
| 6,225,701 | B1 * | 5/2001 | Hori | .................... | H01L 23/4334 257/677 |
| 6,388,311 | B1 * | 5/2002 | Nakashima | ....... | H01L 23/49503 257/666 |
| 7,061,080 | B2 * | 6/2006 | Jeun | ..................... | H01L 21/565 257/666 |
| 7,671,453 | B2 * | 3/2010 | Hayashi | ............ | H01L 23/49575 257/668 |
| 7,923,827 | B2 * | 4/2011 | Heng | .................... | H01L 21/565 257/676 |
| 8,471,373 | B2 * | 6/2013 | Minamio | .......... | H01L 23/49575 257/676 |
| 8,854,820 | B2 * | 10/2014 | Yamamoto | ......... | H05K 7/20154 361/715 |
| 9,099,451 | B2 * | 8/2015 | Ha | ..................... | H01L 23/49531 |
| 10,037,932 | B2 * | 7/2018 | Nishikizawa | ..... | H01L 23/49513 |
| 2002/0057553 | A1 | 5/2002 | Jeon et al. | | |
| 2003/0011054 | A1 * | 1/2003 | Jeun | ..................... | H01L 21/565 257/678 |
| 2004/0089928 | A1 * | 5/2004 | Nakajima | ......... | H01L 23/49537 257/678 |
| 2005/0082690 | A1 | 4/2005 | Hayashi et al. | | |
| 2006/0056213 | A1 * | 3/2006 | Lee | ..................... | H01L 25/162 363/144 |
| 2008/0251904 | A1 * | 10/2008 | Theuss | ................. | H01L 21/563 257/679 |
| 2009/0115038 | A1 * | 5/2009 | Son | ..................... | H01L 21/565 257/675 |
| 2009/0127685 | A1 * | 5/2009 | Jong | .................... | H01L 23/4334 257/676 |
| 2009/0243078 | A1 * | 10/2009 | Lim | .................... | H01L 23/4334 257/690 |
| 2010/0055839 | A1 * | 3/2010 | Nikitin | .............. | H01L 23/49513 438/113 |
| 2011/0204500 | A1 * | 8/2011 | Lim | .................... | H01L 23/4334 257/675 |
| 2011/0304033 | A1 | 12/2011 | Nagano | | |
| 2012/0038033 | A1 * | 2/2012 | Oga | ..................... | H01L 21/565 257/659 |
| 2012/0112332 | A1 * | 5/2012 | Minamio | .............. | H01L 21/565 257/675 |
| 2015/0195950 | A1 * | 7/2015 | Lee | ..................... | H05K 3/0014 361/709 |
| 2015/0214141 | A1 * | 7/2015 | Ye | ..................... | H01L 24/49 257/401 |
| 2016/0254215 | A1 * | 9/2016 | Sato | ..................... | H01L 23/057 257/668 |
| 2017/0077069 | A1 * | 3/2017 | Danno | ................ | H01L 23/047 |
| 2017/0221800 | A1 * | 8/2017 | Nishikizawa | ..... | H01L 23/49562 |
| 2018/0342442 | A1 * | 11/2018 | Haga | .................... | H01L 24/48 |
| 2018/0366395 | A1 * | 12/2018 | Ye | ..................... | H01L 23/49575 |
| 2019/0057928 | A1 * | 2/2019 | Kawashima | ........ | H01L 23/3135 |
| 2019/0109064 | A1 * | 4/2019 | Kao | .................. | H01L 23/49575 |

FOREIGN PATENT DOCUMENTS

| | | | | |
|---|---|---|---|---|
| JP | H02184040 A | 7/1990 | | |
| JP | H05-043475 Y2 | 11/1993 | | |
| JP | H07-045752 A | 2/1995 | | |
| JP | H08-023005 A | 1/1996 | | |
| JP | H10-116847 A | 5/1998 | | |
| JP | 11-307721 | * 11/1999 | ............. | H01L 25/04 |
| JP | 2002-164492 A | 6/2002 | | |
| JP | 2005-123495 A | 5/2005 | | |
| JP | 2006-324401 | * 11/2006 | ............. | H01L 23/29 |
| JP | 2009-302526 A | 12/2009 | | |
| JP | 2010232578 A | 10/2010 | | |
| JP | 2012-000805 A | 1/2012 | | |
| JP | 2015-135907 | * 7/2015 | ............. | H01L 21/56 |
| JP | 2015-191979 A | 11/2015 | | |
| WO | WO 2018/154744 | * 8/2018 | ............. | H01L 23/29 |

OTHER PUBLICATIONS

International Search Report for PCT/JP2016/053808 (Year: 2016).*
English Translation of Written Opinion for PCT/JP2016/053808 (Year: 2016).*
Notification of Transmittal of Translation of the International Preliminary Report on Patentability and Translation of Written Opinion of the International Searching Authority; PCT/JP2016/053808; dated Aug. 23, 2018.
International Search Report issued in PCT/JP2016/053808; dated Apr. 26, 2016.
An Office Action mailed by the Japanese Patent Office dated Oct. 1, 2019, which corresponds to Japanese Patent Application No. 2017-566447 and is related to U.S. Appl. No. 15/763,232; with English translation.

(56) References Cited

OTHER PUBLICATIONS

An Office Action mailed by the Japanese Patent Office dated Mar. 19, 2019, which corresponds to Japanese Patent Application No. 2017-566447 and is related to U.S. Appl. No. 15/763,232.

An Office Action mailed by the Japanese Patent Office dated Jan. 21, 2020, which corresponds to Japanese Patent application No. 2017-566447 and is related to U.S. Appl. No. 15/763,232. with English language translation.

An Office Action issued by the German Patent Office dated Oct. 9, 2020, which corresponds to German Patent Application No. 11 2016 006 381.4 and is related to U.S. Appl. No. 15/763,232 with English language translation.

An Office Action mailed by China National Intellectual Property Administration dated Dec. 23, 2020, which corresponds to Chinese Patent Application No. 201680081114.0 and is related to U.S. Appl. No. 15/763,232 with English language translation.

\* cited by examiner

POWER SEMICONDUCTOR APPARATUS AND MANUFACTURING METHOD THEREFOR

FIELD

The present invention relates to a power semiconductor apparatus and a manufacturing method therefor.

BACKGROUND

Among semiconductor apparatuses, power semiconductor apparatuses are used to control and rectify relatively large power in vehicles such as railroad vehicles, hybrid cars, electric cars, and home electric appliances or industrial machines or the like. Since power semiconductor devices generate heat during use, the devices of the power semiconductor apparatuses are required to have heat dissipation properties. Since high voltages of over several hundreds of volts are applied to the power semiconductor apparatuses, it is necessary to insulate the power semiconductor apparatuses from the outside.

An IPM (intelligent power module) is a module in which a power semiconductor device and a control semiconductor device are integrated together. When a lead frame is used, the power semiconductor device and the control semiconductor device are mounted on die pads which are physically separated from each other. The power semiconductor device is electrically connected to the lead frame using a power metal thin line. The control semiconductor device is electrically connected to the lead frame and the power semiconductor device using the metal thin line respectively.

Various heat dissipating structures are available to cope with heat generation in power semiconductor devices. A most simple structure for a power semiconductor apparatus such as a discrete IC package, a whole surface of which is covered with sealing resin, is a full mode structure in which an insulating section playing the role as a heat dissipating surface is formed of sealing resin having high heat dissipating and insulating properties in a small thickness.

The sealing resin is often molded using a transfer molding method. But with this technique, the sealing resin can be hardly thoroughly supplied into narrow gaps such as a thin insulating section and it is difficult to form an insulating section with a uniform thickness.

In contrast, a structure is reported in which a sheet-like insulating section is pasted to an under surface of a lead frame in advance and then sealed with resin, and the insulating section with a uniform thickness is thereby formed (e.g., see PTL 1). However, when the sheet-like insulating section is pasted and then the lead frame is mounted on a mold metal die, stress is partially generated on an interface between the lead frame and the insulating section due to undulation of the lead frame, which causes bonding performance at an end portion to deteriorate.

CITATION LIST

Patent Literature

[PTL 1]: JP 2002-164492 A
[PTL 2]: JP 1-268159 A
[PTL 3]: JP 2009-302526 A

SUMMARY

Technical Problem

A technique of collectively forming also an insulating section of sealing resin using a transfer molding method is reported (e.g., see PTL 2). Generally, however, when a filler-containing viscoelastic substance is made to flow through a narrow gap portion corresponding to the insulating section, it is not possible to use the filler having diameter of about ½ to ⅓ of the gap thickness to prevent the filler from being clogged. For a power semiconductor apparatus, the insulating section needs to have heat dissipation property as well, but when the insulating section is filled with the filler, it is necessary to form an insulating section having a thickness more than 3 times as big as the filler diameter. This results in a problem that the module size needs to be increased to reduce a heat generating density of the power semiconductor device.

Furthermore, a technique of sealing the insulating section with high thermal conductivity resin through molding and then sealing the other part with low thermal conductivity resin is also reported (e.g., see PTL 3). However, since upper and under surfaces of the lead frame are molded separately from each other, the high thermal conductivity resin is positioned only on the under surface of a ceramic substrate. Therefore, the insulating section which is thin and having a low stress relaxation effect is easily peeled from the high thermal conductivity resin at the ceramic end portion. Furthermore, if the insulating section of the high thermal conductivity resin is formed with a smaller width than the length of the ceramic substrate, an interface between the high thermal conductivity resin and the low thermal conductivity resin is positioned directly under the ceramic substrate. If the ceramic substrate is replaced by the lead frame, the problem is that the interface between both types of resin includes a low density resin part such as void where the withstand voltage decreases and insulation reliability deteriorates.

The present invention has been implemented to solve the above-described problems and it is an object of the present invention to provide a power semiconductor apparatus that can be downsized and can provide high insulation reliability and a manufacturing method therefor.

Solution to Problem

A power semiconductor apparatus according to the present invention includes: a lead frame including an inner lead, an outer lead connected to the inner lead, and a power die pad; a power semiconductor device bonded onto the power die pad; a first metal thin line electrically connecting the inner lead and the power semiconductor device; and sealing resin sealing the inner lead, the power die pad, the power semiconductor device, and the first metal thin line, wherein the sealing resin includes an insulating section directly beneath the power die pad, a thickness of the insulating section is 1 to 4 times a maximum particle diameter of inorganic particles in the sealing resin, and a first hollow is provided on an upper surface of the sealing resin directly above the power die pad in a region without the first metal thin line and the power semiconductor device.

Advantageous Effects of Invention

In the present invention, by making the thickness of the insulating section uniform, it is possible to prevent concentration of an electric field when the electric field is applied and obtain high insulation reliability. Thinning the insulating section makes it possible to use a smaller power semiconductor device with a higher heat generation density and reduce the size of the power semiconductor apparatus.

DESCRIPTION OF EMBODIMENTS

A power semiconductor apparatus and a manufacturing method therefor according to the embodiments of the present invention will be described with reference to the drawings. The same components will be denoted by the same symbols, and the repeated description thereof may be omitted.

First Embodiment

Figure 1:
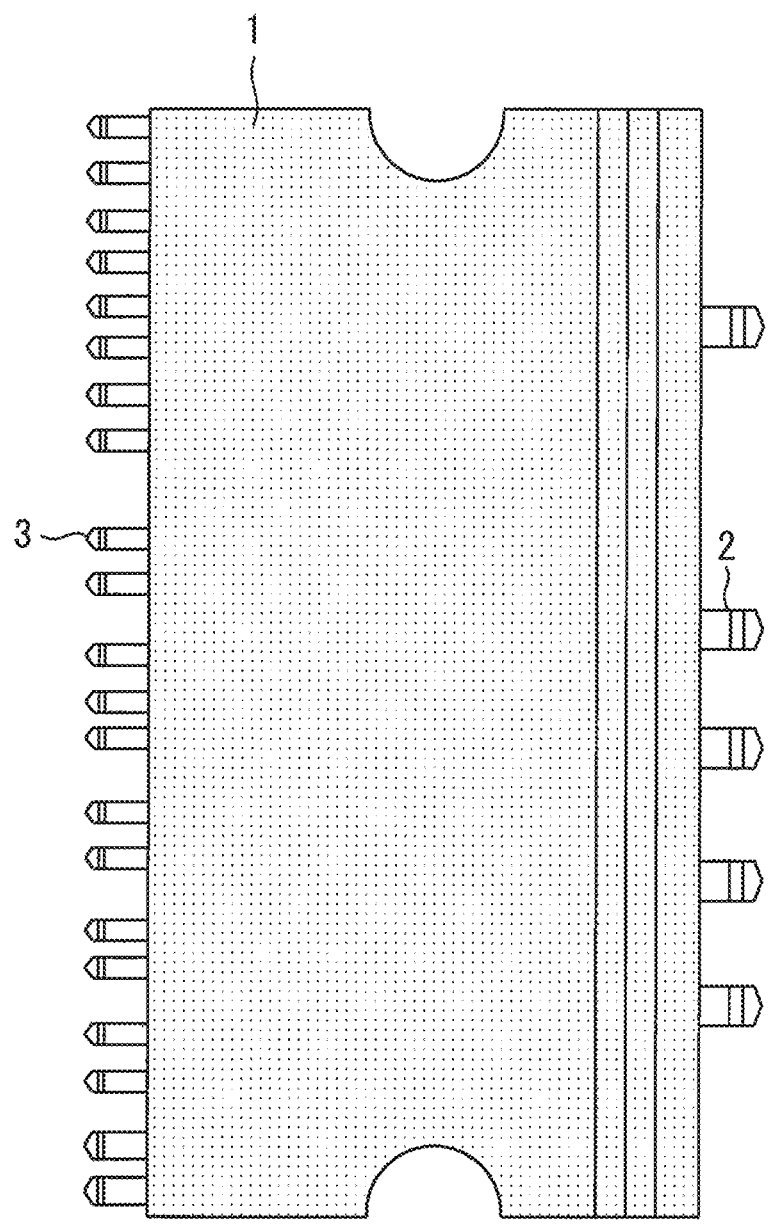
FIG. 1 is a bottom view illustrating a power semiconductor apparatus according to a first embodiment of the present invention.

FIG. 1 is a bottom view illustrating a power semiconductor apparatus according to a first embodiment of the present invention. The power semiconductor apparatus is a DIP type package, both upper and under surfaces of which are sealed with sealing resin 1 and outer leads 2 and 3 project from both end portions of the apparatus. The outer leads 2 are power outer leads and the outer leads 3 are control outer leads.

Figure 2:
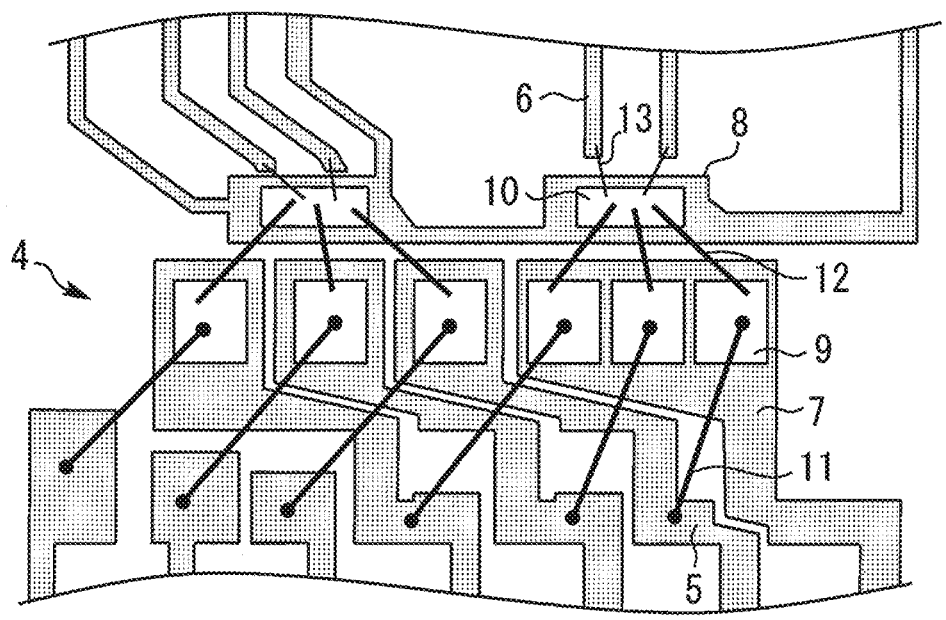
FIG. 2 is a plan view illustrating an interior of the power semiconductor apparatus according to the first embodiment of the present invention.

FIG. 2 is a plan view illustrating an interior of the power semiconductor apparatus according to the first embodiment of the present invention. A lead frame 4 includes inner leads 5 and 6, the outer leads 2 and 3 connected to the inner leads 5 and 6 respectively, a power die pad 7 and a control die pad 8. The lead frame 4 has a thickness of 0.4 mm.

Power semiconductor devices 9 which are RC-IGBTs (reverse conducting-insulated gate bipolar transistors) are bonded onto the power die pad 7 via Pb-free solder. A control semiconductor device 10 which is an IC that controls the power semiconductor device 9 is bonded to the control die pad 8 using a conductive adhesive. Note that the power semiconductor device 9 is not limited to the RC-IGBT, but may be a combination of an IGBT and a diode or a MOSFET. The power semiconductor device 9 and the power die pad 7 may be bonded together using not only solder but also a conductive bonding member such as a conductive adhesive.

A metal thin line 11 electrically connects the inner lead 5 and a source electrode on an upper surface of the power semiconductor device 9. A metal thin line 12 electrically connects a gate electrode on the upper surface of the power semiconductor device 9 and the control semiconductor device 10. A metal thin line 13 electrically connects the inner lead 6 and the control semiconductor device 10. The metal thin line 11 is an Al wire of ϕ0.3 mm or may also be a wire of an Al-based alloy, other metal such as Ag or Cu, or an alloy. The metal thin lines 12 and 13 are Au wires having a smaller line diameter than the Al wire, but the metal thin lines 12 and 13 may also be wires using a gold-based alloy or other metal such as Ag or Cu or an alloy.

Figure 3:
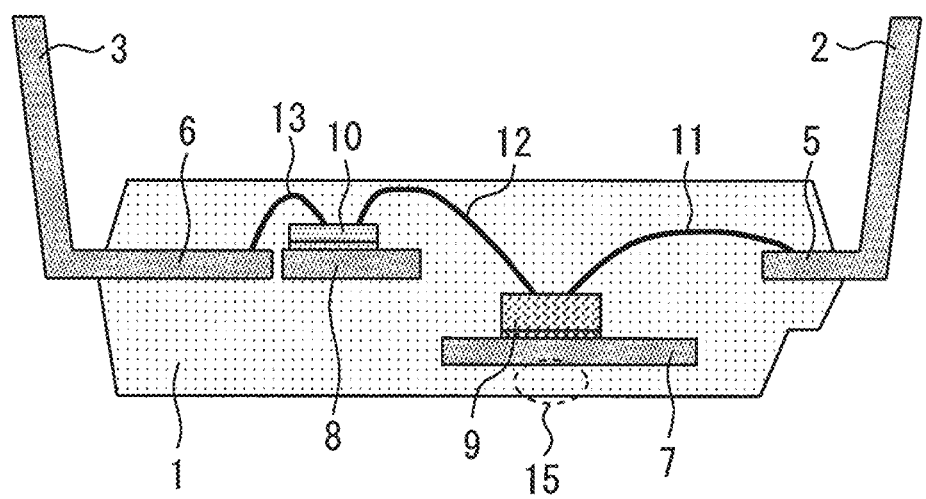
FIG. 3 is a cross-sectional view illustrating the power semiconductor apparatus according to the first embodiment of the present invention.
Figure 4:
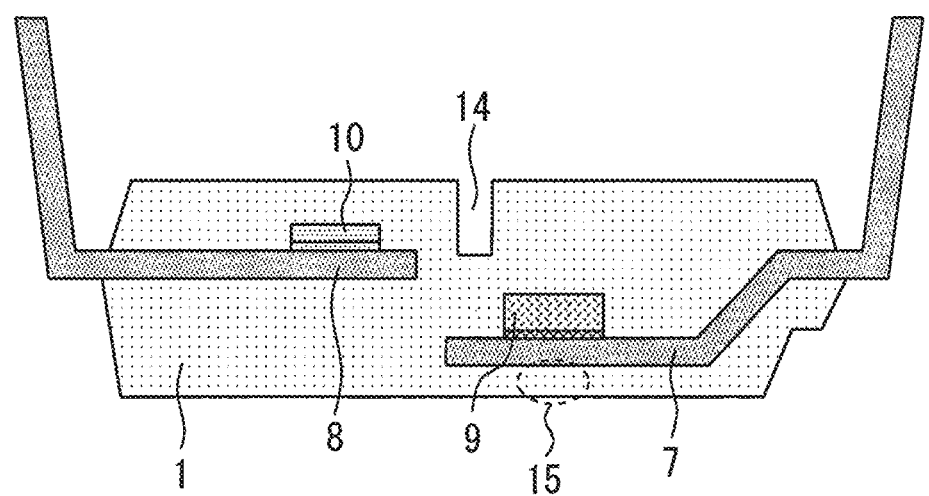
FIG. 4 is a cross-sectional view illustrating the power semiconductor apparatus according to the first embodiment of the present invention.

FIG. 3 and FIG. 4 are cross-sectional views illustrating the power semiconductor apparatus according to the first embodiment of the present invention. FIG. 3 is a cross-sectional view along the metal thin lines 11 to 13 and FIG. 4 is a cross-sectional view of a region without the metal thin lines 11 to 13.

Sealing resin 1 seals the inner leads 5 and 6, the power die pad 7, the control die pad 8, the power semiconductor device 9, the control semiconductor device 10 and the metal thin lines 11 to 13. A first hollow 14 is provided on an upper surface of the sealing resin 1 directly above the power die pad 7 in a region without the metal thin lines 11 and 12 and the power semiconductor device 9 on the control die pad 8 side with respect to the power semiconductor device 9.

The lead frame 4 is provided with difference in level so that the power die pad 7 is positioned lower than the outer leads 2 and 3 and the inner leads 5 and 6. The sealing resin 1 includes an insulating section 15 directly beneath the power die pad 7. The thickness of the insulating section 15 is 1 to 4 times a maximum particle diameter of inorganic particles in the sealing resin 1 and is preferably 220 μm or less with which heat dissipation is obtained. The sealing resin 1 is formed of a mixture of resin and high thermal conductivity filler, and the thermal conductivity increases as the amount of filler increases. It does not matter whether the raw material of the resin is thermoplastic or thermosetting as long as adhesiveness can be obtained. The thermal conductivity filler is particles of an inorganic material such as $SiO_2$, $Al_2O_3$ or BN that can achieve both electric insulation and high thermal conductivity.

Figure 5:
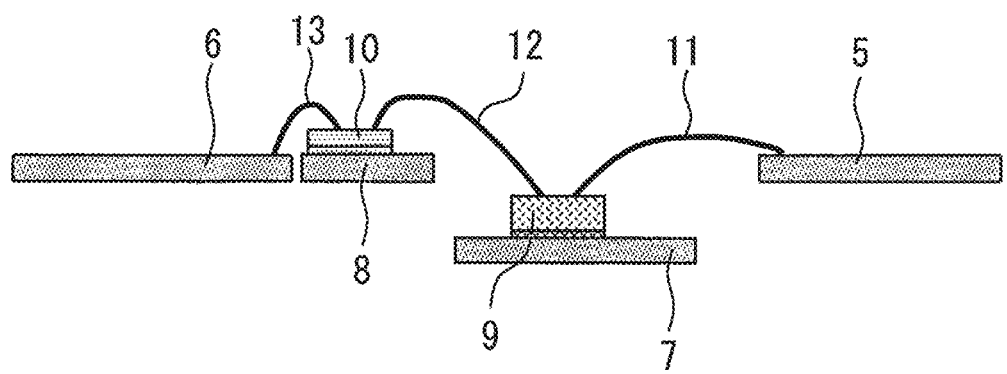
FIG. 5 is a cross-sectional view illustrating the manufacturing method for the power semiconductor apparatus according to the first embodiment of the present invention.

Next, a manufacturing method for the power semiconductor apparatus according to the present embodiment will be described. FIGS. 5 to 10 are cross-sectional views illustrating the manufacturing method for the power semiconductor apparatus according to the first embodiment of the present invention. FIGS. 5 and 10 are cross-sectional views along the metal thin lines 11 to 13 and FIGS. 6 to 9 are cross-sectional views of a region without the metal thin lines 11 to 13. A sealing method for the power semiconductor apparatus is a compression molding method.

First, as shown in FIG. 5, the lead frame 4 including the inner leads 5 and 6, the outer leads 2 and 3, the power die pad 7 and the control die pad 8 is prepared. Next, the power semiconductor device 9 is bonded onto the power die pad 7 via Pb-free solder and the control semiconductor device 10 is bonded onto the control die pad 8 using a conductive adhesive or solder. The inner lead 5 and the source electrode of the power semiconductor device 9 are electrically connected via the metal thin line 11. The gate electrode of the power semiconductor device 9 and the control semiconductor device 10 are electrically connected via the metal thin line 12. The inner lead 6 and the control semiconductor device 10 are electrically connected via the metal thin line 13.

Figure 6:
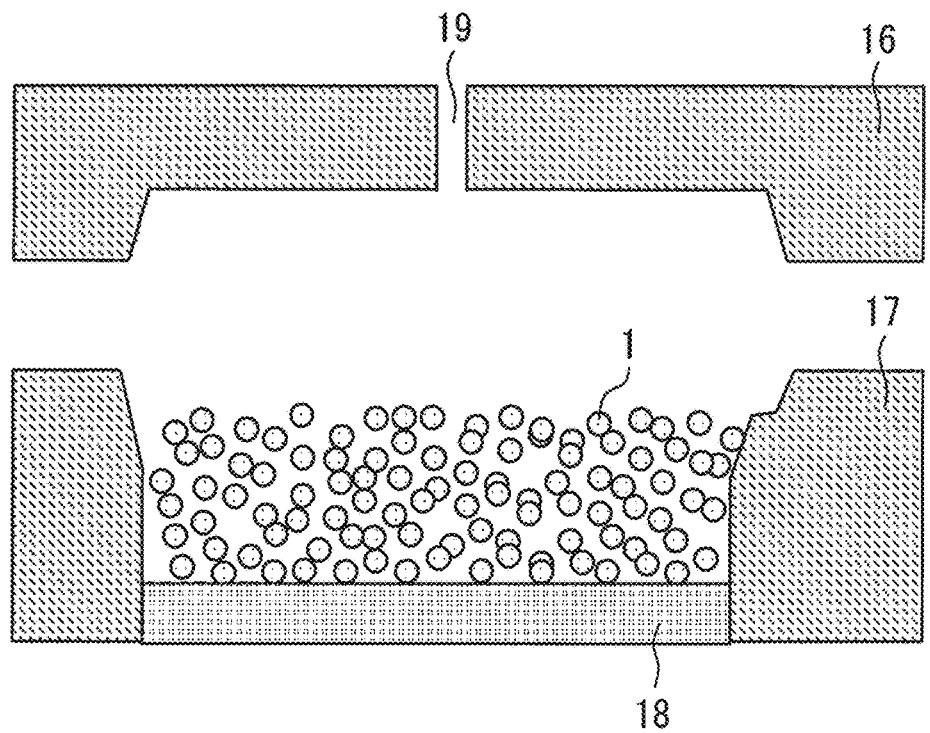
FIG. 6 is a cross-sectional view illustrating the manufacturing method for the power semiconductor apparatus according to the first embodiment of the present invention.

Next, as shown in FIG. 6, a resin sealing metal die composed of an upper metal die 16 and a lower metal die 17 is prepared. The lower metal die 17 is provided with a movable cavity 18 on a bottom surface. Next, the powdered sealing resin 1 is uniformly spread over the movable cavity 18. The sealing resin 1 may be powdered, granular solid, liquid or sheet-like, and can take any form as long as it can be uniformly distributed over the whole movable cavity 18.

Figure 7:
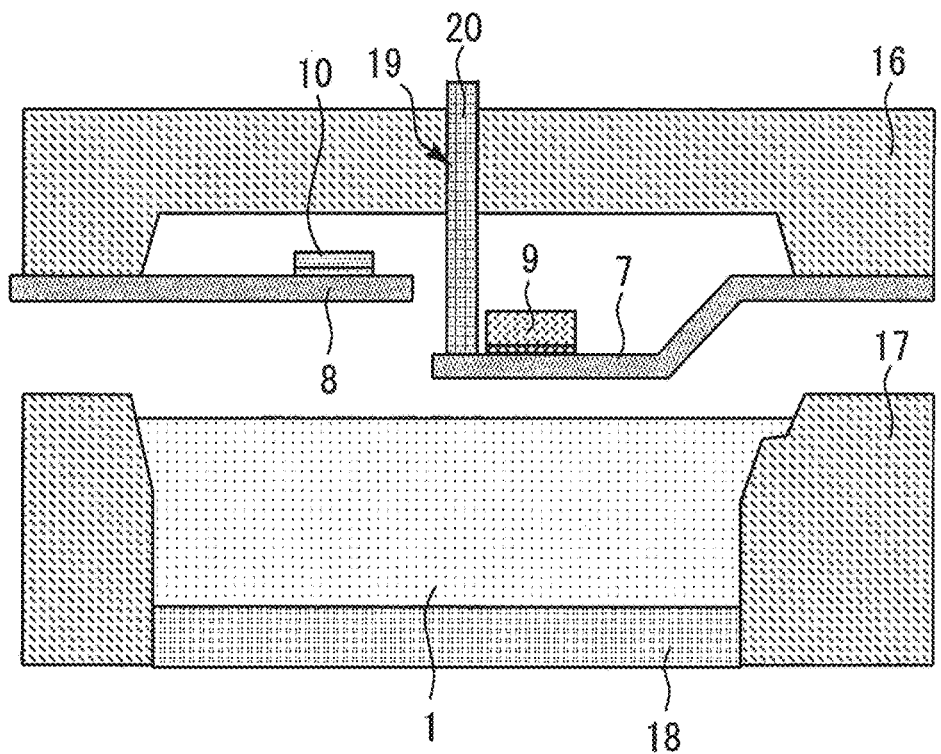
FIG. 7 is a cross-sectional view illustrating the manufacturing method for the power semiconductor apparatus according to the first embodiment of the present invention.

Next, as shown in FIG. 7, the lead frame 4 is fixed to the upper metal die 16 through vacuum suction or the like, a first metal die pin 20 is made to project out from a first sliding part 19 of the upper metal die 16 and made to come into contact with the upper surface of the power die pad 7. The power semiconductor device 9, the control semiconductor device 10 and the metal thin lines 11 to 13 are opposed to the upper metal die 16. The sealing resin 1 is melted with heat from the lower metal die.

Figure 8:
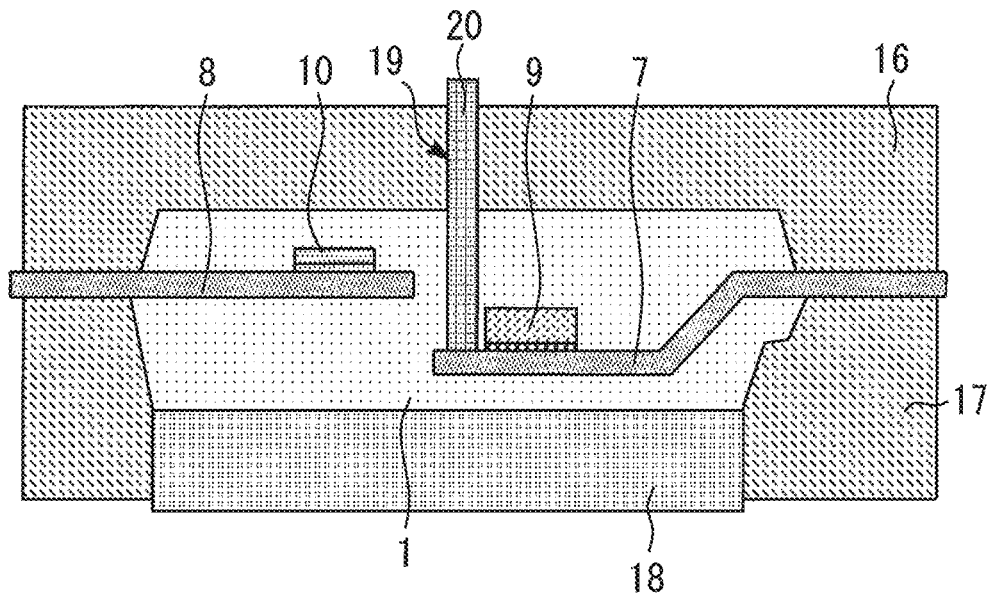
FIG. 8 is a cross-sectional view illustrating the manufacturing method for the power semiconductor apparatus according to the first embodiment of the present invention.

Next, as shown in FIG. 8, while the sealing resin 1 is in a molten state, the metal die is closed with the lead frame 4 being sandwiched between the upper metal die 16 and the lower metal die 17. At this time, the power die pad 7 and the control die pad 8 are sunk into the molten sealing resin 1. The movable cavity 18 moves upward and pushes up the molten sealing resin 1. The entire upper metal die 16 is left to fill with the sealing resin 1. In this way, while keeping the first metal die pin 20 in contact with the upper surface of the power die pad 7, the sealing resin 1 is filled from the under surface of the power die pad 7 through compression molding to thereby seal the power semiconductor device 9 or the like.

Figure 9:
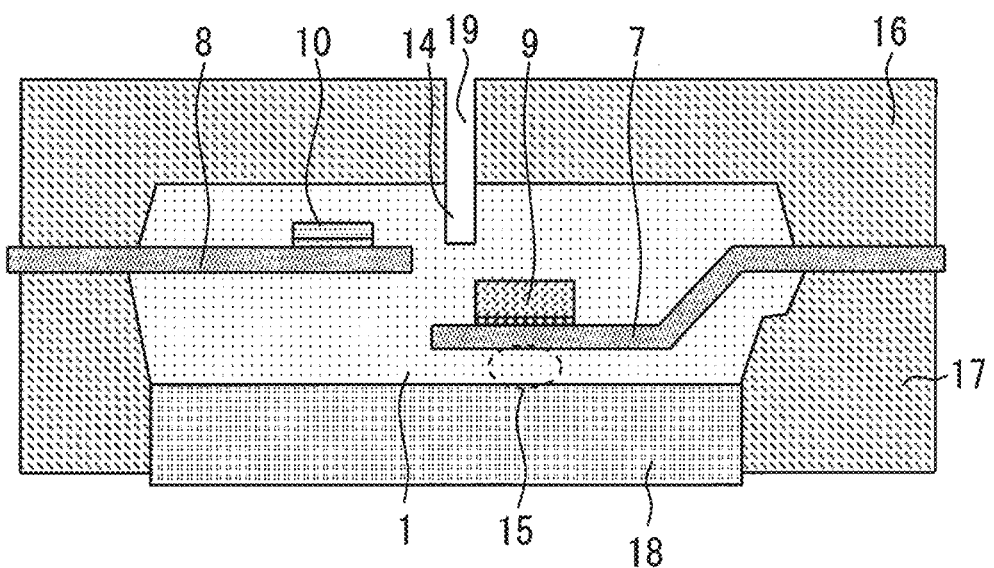
FIG. 9 is a cross-sectional view illustrating the manufacturing method for the power semiconductor apparatus according to the first embodiment of the present invention.
Figure 10:
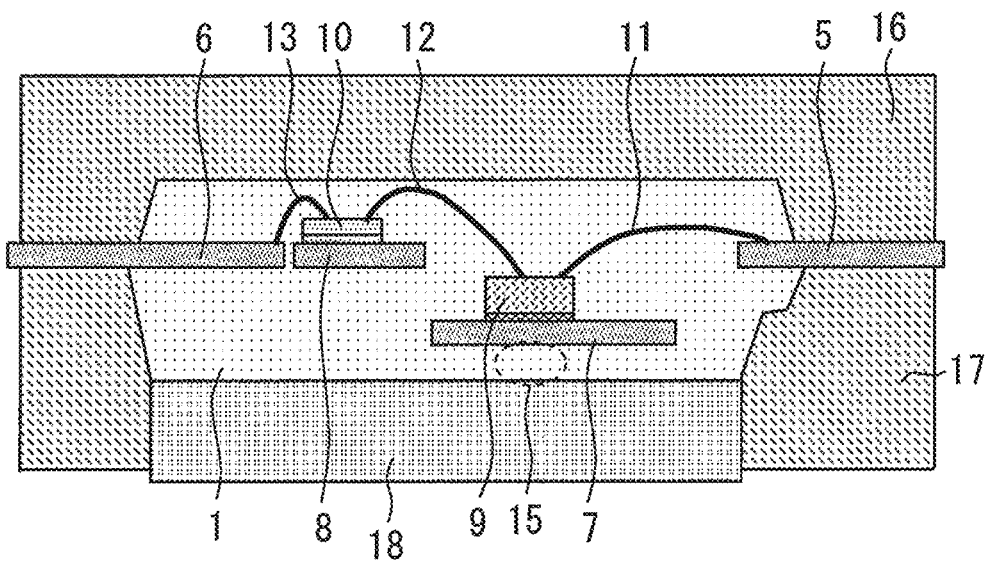
FIG. 10 is a cross-sectional view illustrating the manufacturing method for the power semiconductor apparatus according to the first embodiment of the present invention.

Next, as shown in FIG. 9, the first metal die pin 20 is pulled out, a hydrostatic pressure is applied with the molten sealing resin 1, and a volatile content existing between the upper metal die 16 and the lower metal die 17 is deaerated through the first sliding part 19. The sealing resin 1 is cured within the resin sealing metal die to form a sealing body and the sealing body is extracted from the resin sealing metal die. After that, the package outside shape and the outer leads are subjected to outline machining through an additional curing process such as post curing, and the power semiconductor apparatus according to the present embodiment is thereby completed.

According to a conventional transfer molding method, sealing resin is made to flow inward from a side face of the package. Since the thickness of the insulating section of the under surface of the die pad is small, in the transfer molding, the sealing resin hardly flows due to flowing resistance and clogging of the filler and filling is delayed. As a result, the filling of the insulating section with the sealing resin is delayed or the final filling position is reached, causing a void or weld to occur, resulting in a problem that the withstand voltage decreases.

In contrast, in the present embodiment, the sealing resin 1 is spread over one surface of the lower metal die 17 using the compression molding method in advance and the insulating section 15 is filled with the sealing resin 1 at an initial stage of the flow of the sealing resin 1. For this reason, no void or weld is generated in the insulating section 15.

Furthermore, by causing the first metal die pin 20 to come into contact with the upper surface of the power die pad 7, it is possible to suppress deformation of the power die pad 7 that receives flow resistance of the sealing resin 1 that flows from below and secure a uniform thickness of the insulating section 15. By making the thickness of the insulating section 15 uniform, it is possible to prevent concentration of an electric field when the electric field is applied and obtain high insulation reliability. In this case, the first hollow 14 is provided as a trace of the pulled-out first metal die pin 20.

Furthermore, when the deformation of the power die pad 7 is suppressed, deformation of the metal thin lines 11 and 12 connected to the power semiconductor device 9 on the power die pad 7 is also suppressed and wire bonding performance improves. In order to suppress deformation of the metal thin line 12 in particular, it is preferable to cause the first metal die pin 20 to come into contact with the part on the control die pad 8 side with respect to the power semiconductor device 9 on the upper surface of the power die pad 7. In this case, the first hollow 14 is provided on the control die pad 8 side with respect to the power semiconductor device 9 in a region without the metal thin line 12.

In compression molding, the sealing resin 1 flows from below to above, a volatile part is discharged from the resin, and the package surface which faces the upper metal die 16 becomes a final filling position. The final filling often becomes void, but if the first metal die pin 20 which is slidable with respect to the upper metal die 16 is provided as in the case of the present invention, the volatile part passes through the sliding section, thus eliminating the void and allowing high insulating quality to be secured.

Figure 11:
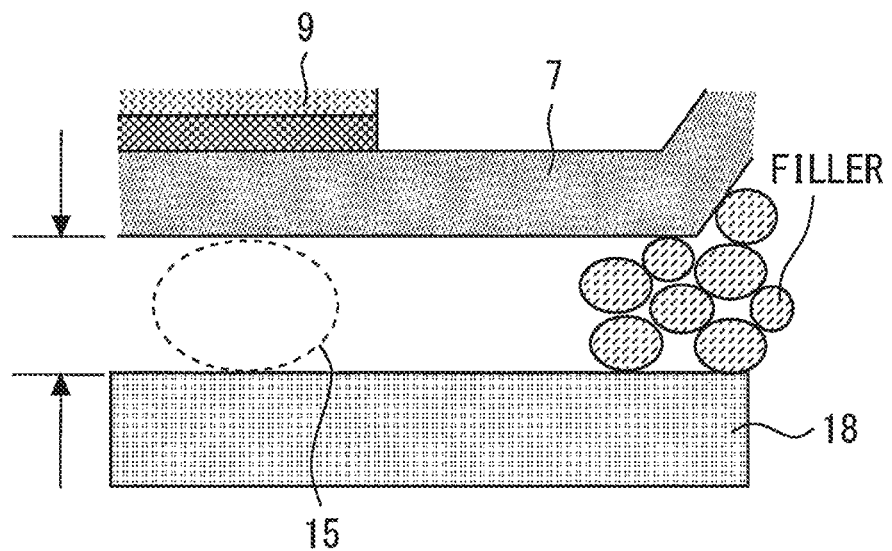
FIG. 11 is a cross-sectional view illustrating a situation in which the insulating section is filled according to the transfer molding method.
Figure 12:
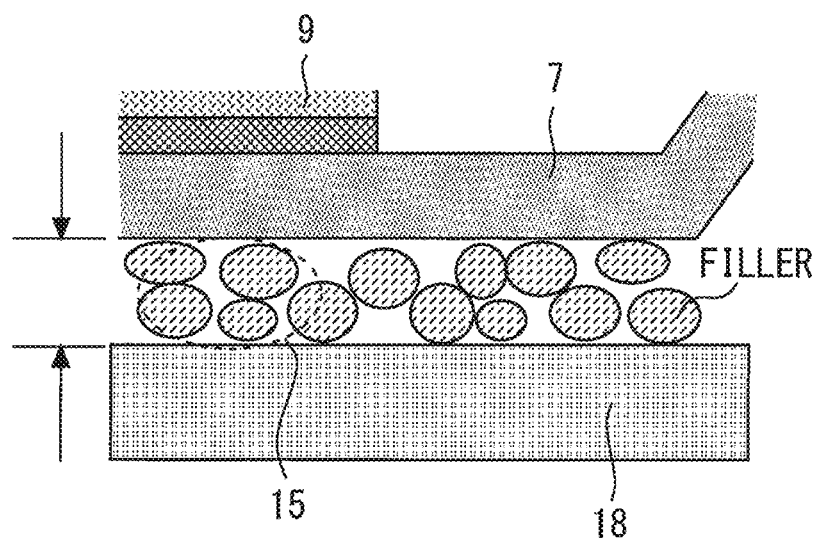
FIG. 12 is a cross-sectional view illustrating a situation in which the insulating section is filled according to the compression molding method.

FIG. 11 is a cross-sectional view illustrating a situation in which the insulating section is filled according to the transfer molding method. FIG. 12 is a cross-sectional view illustrating a situation in which the insulating section is filled according to the compression molding method. Table 1 shows an experiment result of filling the insulating section using the transfer molding method and the compression molding method. Common sealing resin having a maximum filler particle diameter of 55 μm is used.

TABLE 1

| Thickness of insulating section | Transfer molding method | Compression molding method |
|---|---|---|
| 60 μm | x | ○ |
| 100 μm | x | ○ |
| 220 μm | x | ○ |

A case will be considered where the insulating section 15, a thickness of which is d=60 to 220 μm equivalent to 1 to 4 times the maximum filler particle diameter, is filled with the sealing resin 1. In the case of the transfer molding method, as shown in FIG. 11, clogging with the filler occurs at an inflow port, preventing further filling, and the thickness of the insulating section 15 needs to be more than 4 times as large as the maximum filler particle diameter. On the other hand, in the case of the compression molding method, as shown in FIG. 12, the insulating section 15 can be filled to an extent equivalent to the maximum filler particle diameter, and so the thickness of the insulating section 15 can be set to d'<d.

Figure 13:
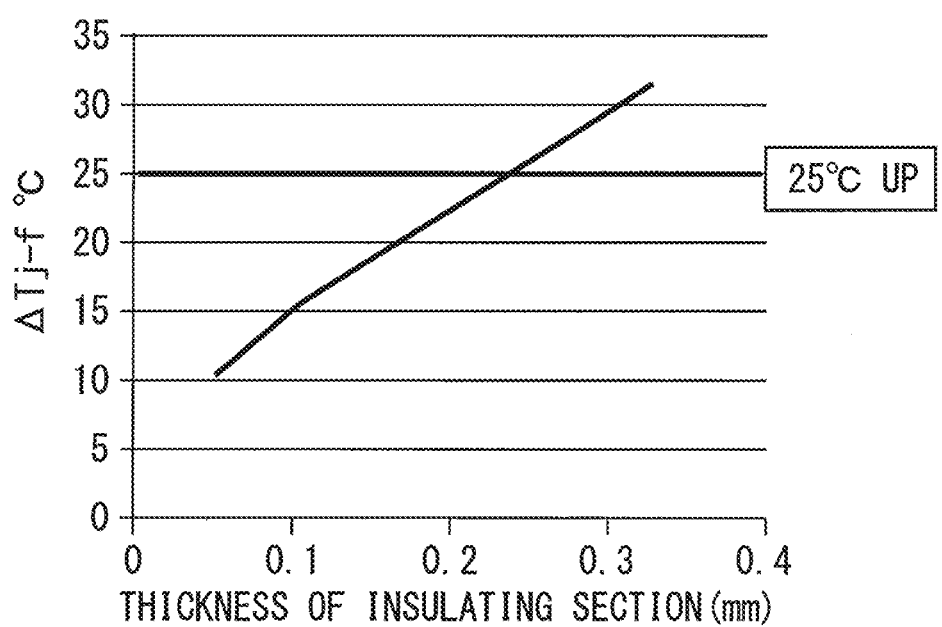
FIG. 13 is a diagram illustrating a relationship between a difference ΔTj–f between a chip temperature Tj and grease under surface temperature Tf, and a thickness of the insulating section.

FIG. 13 is a diagram illustrating a relationship between a difference ΔTj−f between a chip temperature Tj and grease under surface temperature Tf, and a thickness of the insulating section. Grease having a thermal conductivity of 1.5 W/m·K is applied to the whole under surface of the insulating section 15 to a thickness of 20 μm and the power semiconductor device 9 having a high heat generation density of 1 W/mm$^2$ or higher is used. To obtain thermal resistance corresponding to a ΔTj−f of 25° C. or less, the insulating section 15 needs to be set to 220 μm or less using the sealing resin 1 having a thermal conductivity of 3 W/m·K. For this reason, use of the present embodiment that takes advantage of thinning makes it possible to use a smaller power semiconductor device 9 with a higher heat generation density and reduce the size of the power semiconductor apparatus.

Note that even when the sealing resin 1, a maximum filler particle diameter of which is other than 55 μm is used, the thickness of the insulating section 15 can be 4 times or less than the maximum filler particle diameter. Using the sealing resin 1 having a small filler particle diameter of 25 μm allows further thinning.

Second Embodiment

Figure 14:
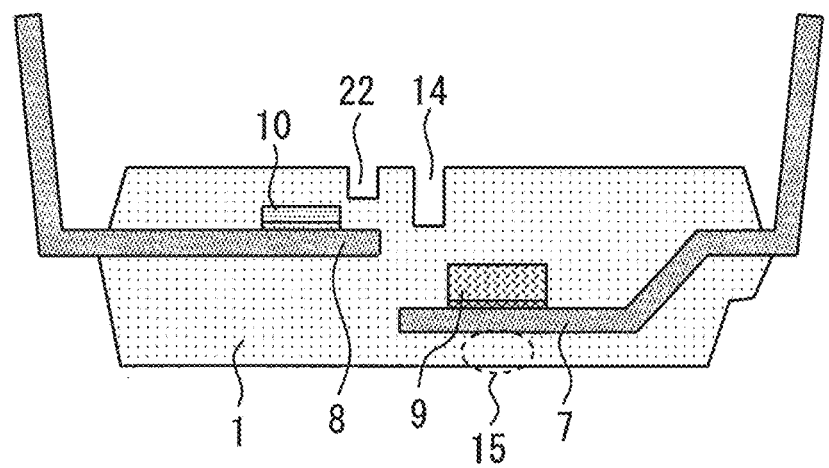
FIG. 14 is a cross-sectional view illustrating a power semiconductor apparatus according to a second embodiment of the present invention.

FIG. 14 is a cross-sectional view illustrating a power semiconductor apparatus according to a second embodiment of the present invention. A second hollow 22 is provided on an upper surface of the sealing resin 1 directly above the control die pad 8 in a region without the metal thin line 12 and the control semiconductor device 10.

Figure 15:
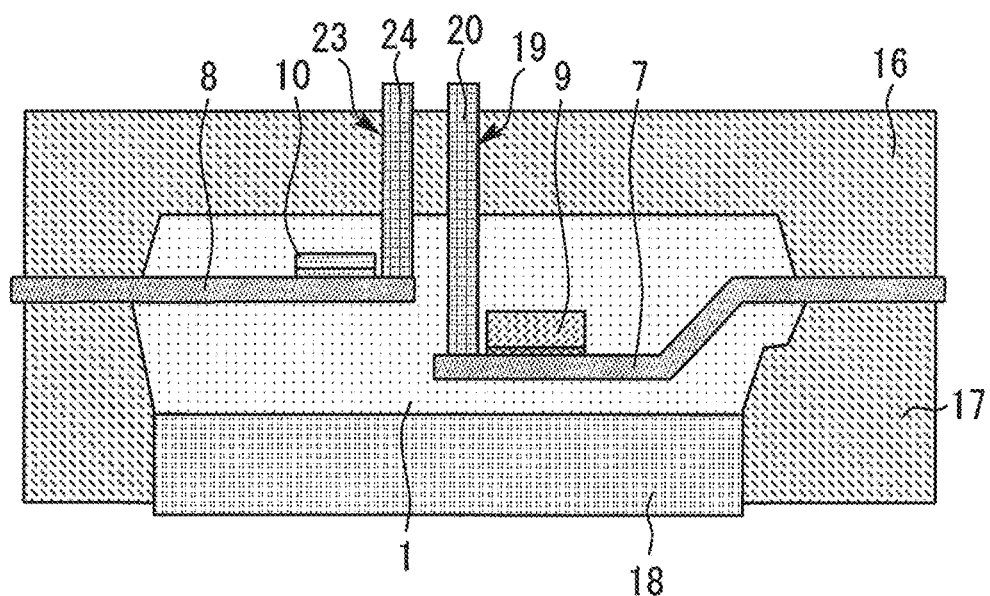
FIG. 15 is a cross-sectional view illustrating a manufacturing method for the power semiconductor apparatus according to the second embodiment of the present invention.

FIG. 15 is a cross-sectional view illustrating a manufacturing method for the power semiconductor apparatus according to the second embodiment of the present invention. A second metal die pin 24 is made to project out from a second sliding part 23 of the upper metal die 16, and while keeping the second metal die pin 24 in contact with the upper surface of the control die pad 8, sealing is performed using the sealing resin 1. Next, the second metal die pin 24 is pulled out and the sealing resin 1 is left to cure.

Thus, by causing the second metal die pin 24 to come into contact with the upper surface of the control die pad 8 to thereby suppress deformation of the control die pad 8 that receives flow resistance of the sealing resin 1 flowing from below, deformation of the metal thin lines 11 and 12 is further suppressed and wire bonding performance improves. In this case, the second hollow 22 is provided as a trace of the pulled-out second metal die pin 24.

Third Embodiment

Figure 18:
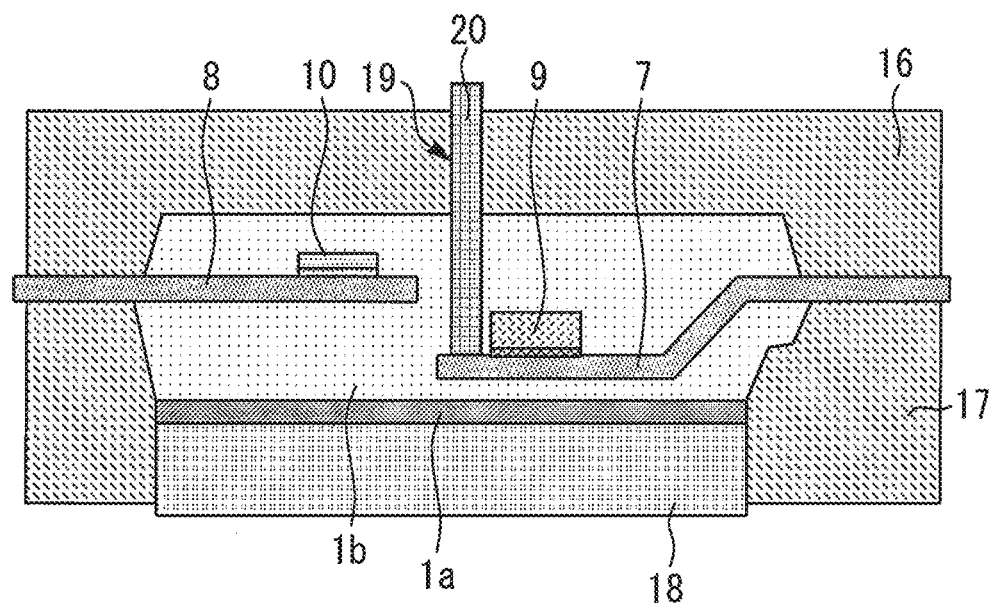
FIG. 18 is a cross-sectional view illustrating a manufacturing method for a power semiconductor apparatus according to a third embodiment of the present invention.
Figure 19:
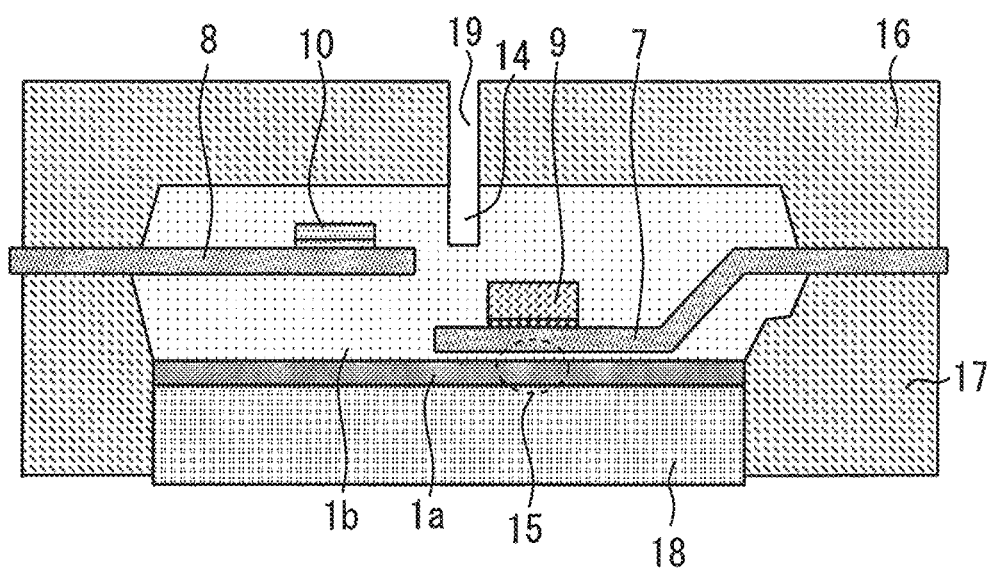
FIG. 19 is a cross-sectional view illustrating a manufacturing method for a power semiconductor apparatus according to a third embodiment of the present invention.
Figure 20:
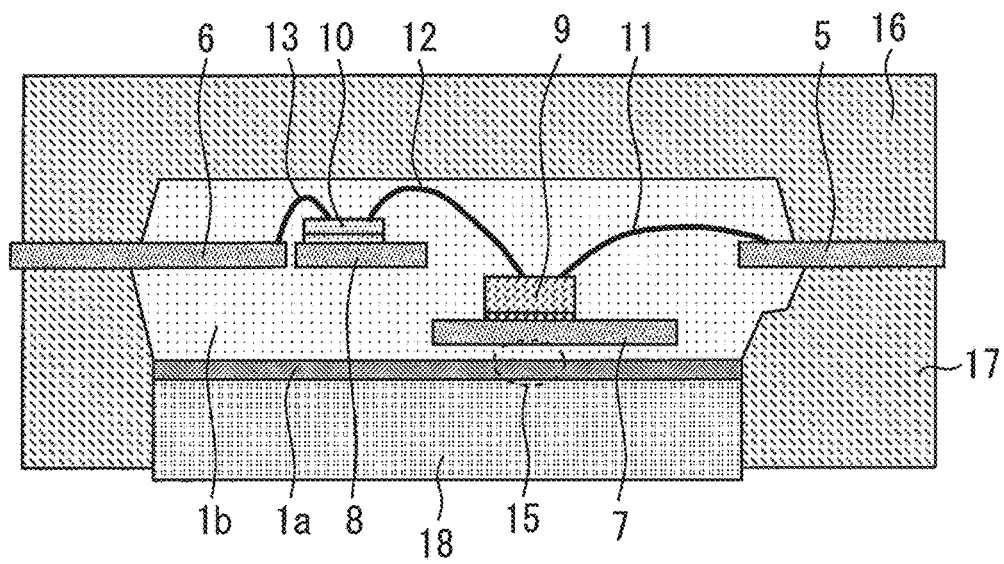
FIG. 20 is a cross-sectional view illustrating a manufacturing method for a power semiconductor apparatus according to a third embodiment of the present invention.

FIGS. 16 to 20 are cross-sectional views illustrating a manufacturing method for a power semiconductor apparatus according to a third embodiment of the present invention. FIGS. 16 to 19 are cross-sectional views of a region without the metal thin lines 11 to 13 and FIG. 20 is a cross-sectional view along the metal thin lines 11 to 13.

Figure 16:
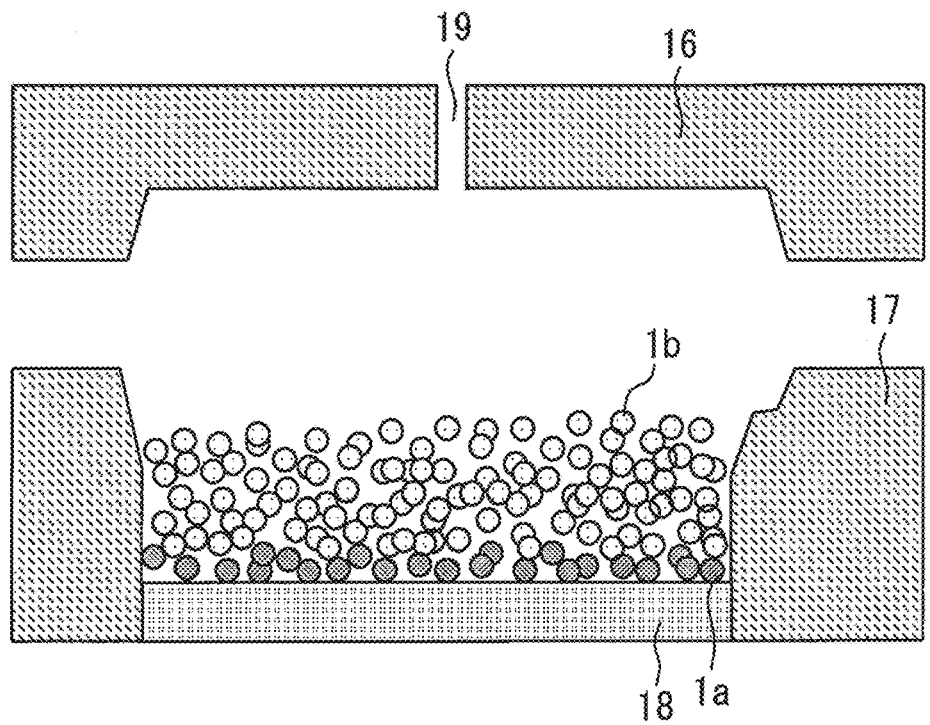
FIG. 16 is a cross-sectional view illustrating a manufacturing method for a power semiconductor apparatus according to a third embodiment of the present invention.

First, a resin sealing metal die composed of the upper metal die 16 and the lower metal die 17 is prepared as in the case of the first embodiment. Next, as shown in FIG. 16, first sealing resin 1a is supplied onto the movable cavity 18 and second sealing resin 1b is supplied onto the first sealing resin 1a, uniformly as the sealing resin 1. The second sealing resin 1b has a lower filler (inorganic particles) content concentration than the first sealing resin 1a and has more resin components. Therefore, the second sealing resin 1b in the upper layer obtains strong adhesiveness, whereas the first sealing resin 1a in the lower layer has a higher thermal conductivity than the second sealing resin 1b in the upper layer. Note that the first and second sealing resin 1a and 1b are powdered, granular solid, liquid or sheet-like.

Figure 17:
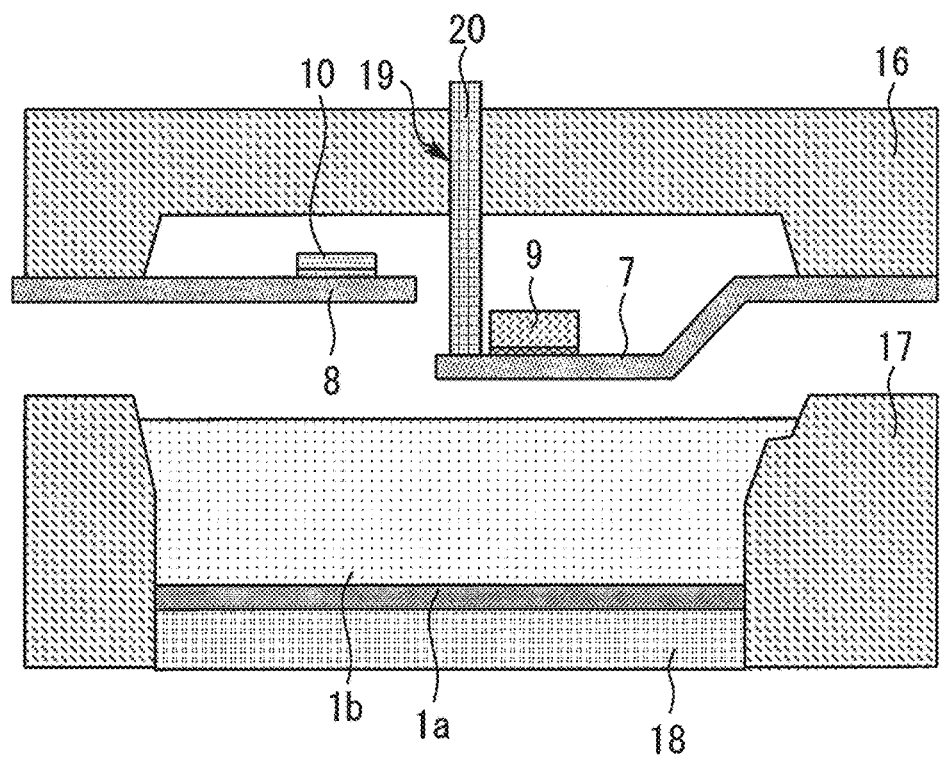
FIG. 17 is a cross-sectional view illustrating a manufacturing method for a power semiconductor apparatus according to a third embodiment of the present invention.

Next, as shown in FIG. 17, the lead frame 4 is fixed to the upper metal die 16 through vacuum suction or the like, the first metal die pin 20 is made to project out to come into contact with the upper surface of the power die pad 7. The power semiconductor device 9, the control semiconductor device 10 and the metal thin lines 11 to 13 are opposed to the upper metal die 16. The first and second sealing resin 1a and 1b are melted with heat from the lower metal die.

Next, as shown in FIG. 18, while the first and second sealing resin 1a and 1b are in a molten state, the metal die is closed with the upper metal die 16 and the lower metal die 17 sandwiching the lead frame 4. At this moment, the power die pad 7 and the control die pad 8 are sunken into the molten second sealing resin 1b. The movable cavity 18 moves upward and pushes up the molten first and second sealing resin 1a and 1b. The second sealing resin 1b is left to fill up to the whole upper metal die 16. In this case, since the low viscosity second sealing resin 1b has a large flow rate, the second sealing resin 1b is excluded so as to be pushed out from below the power die pad 7. On the other hand, the high viscosity first sealing resin 1*a* remains below the power die pad 7, forming most of the insulating section 15. As a result, a layered product of the thin second sealing resin 1*b* and the first sealing resin 1*a* is formed as the insulating section 15. Therefore, the concentration of inorganic particles included in the insulating section 15 increases from the under surface of the power die pad 7 toward the under surface of the sealing resin 1.

Next, as shown in FIG. 19 and FIG. 20, the first metal die pin 20 is pulled out, and a hydrostatic pressure is applied with the first and second sealing resin 1*a* and 1*b* melted by further pressurization. The first and second sealing resin 1*a* and 1*b* are left to cure within the resin sealing metal die to form a sealing body and the sealing body is extracted from the resin sealing metal die. After that, the package outside shape and the outer leads are subjected to outline machining through an additional curing process such as post curing, and the power semiconductor apparatus according to the present embodiment is thereby completed.

In the present embodiment, the sealing resin 1 includes the first sealing resin 1*a* and the second sealing resin 1*b* provided on the first sealing resin 1*a* and having a lower content concentration of inorganic particles than the first sealing resin 1*a*. The high heat conduction first sealing resin 1*a* can realize high heat dissipation. However, while the filler amount of the first sealing resin 1*a* is increased, the resin component decreases and the bonding strength is reduced. Thus, the second sealing resin 1*b* with a small filler amount and with high adhesion strength is formed to be so thin as to come into contact with the under surface of the power die pad 7, and the adhesion of the sealing resin 1 to the power die pad 7 is thereby increased. For this reason, it is possible to obtain high bonding reliability while attaining high heat dissipation of the insulating section 15.

The viscosity of the sealing resin also increases as the amount of filler increases. When the whole module is sealed with the high heat conduction first scaling resin 1*a* in an attempt to attain high heat dissipation of the module, the flow resistance to the metal thin lines 11 to 13 is increased by the high viscosity first sealing resin 1*a*. As a result, the amount of deformation of the metal thin lines 11 to 13 increases and there is a possibility that a short circuit will occur. In contrast, in the present embodiment, the high heat conduction first sealing resin 1*a* remains within the insulating section 15 and never comes into contact with the metal thin lines 11 to 13.

Fourth Embodiment

Figure 25:
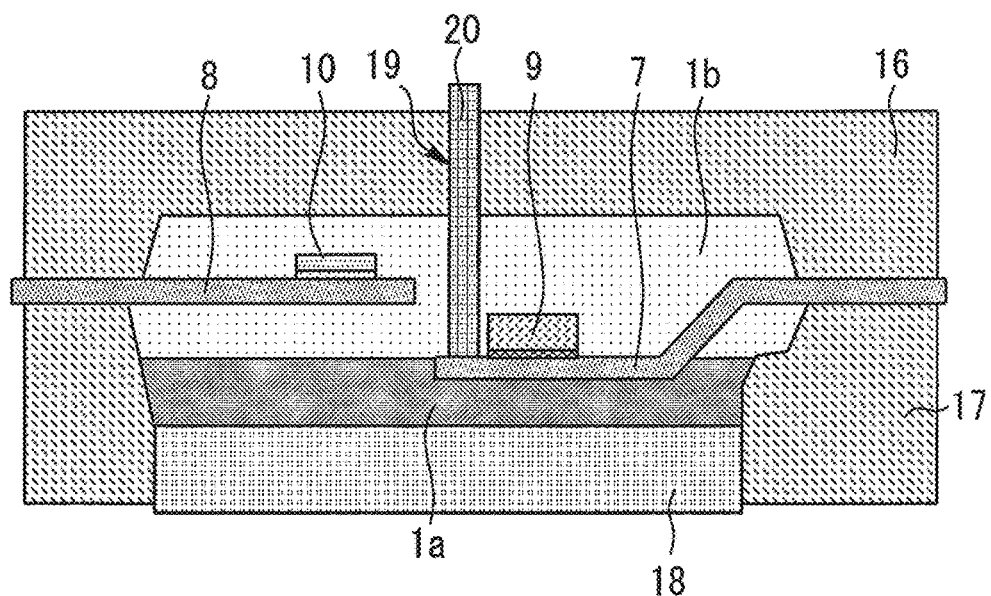
FIG. 25 is a cross-sectional view illustrating a manufacturing method for a power semiconductor apparatus according to a fourth embodiment of the present invention.
Figure 26:
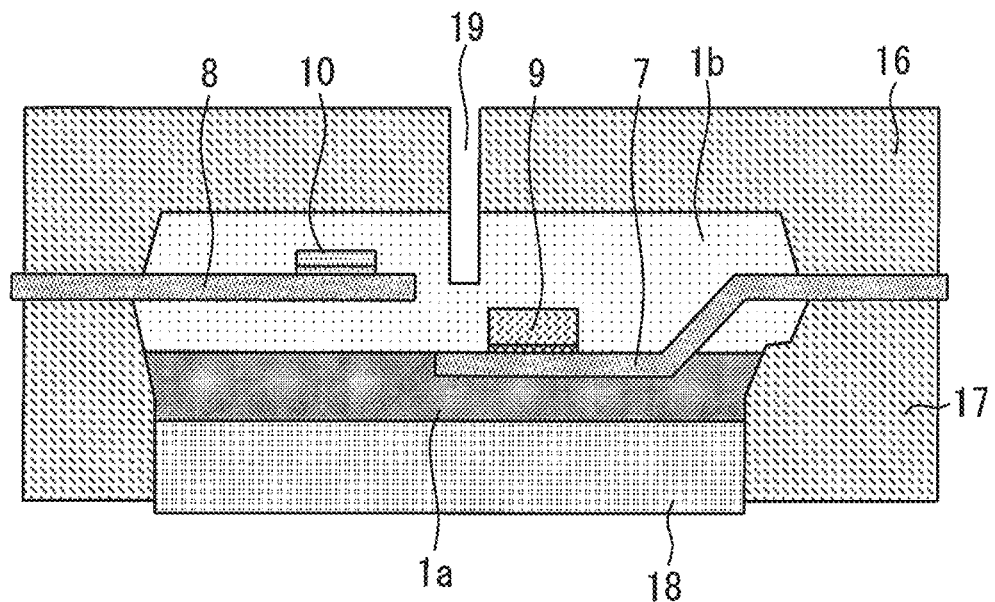
FIG. 26 is a cross-sectional view illustrating a manufacturing method for a power semiconductor apparatus according to a fourth embodiment of the present invention.
Figure 27:
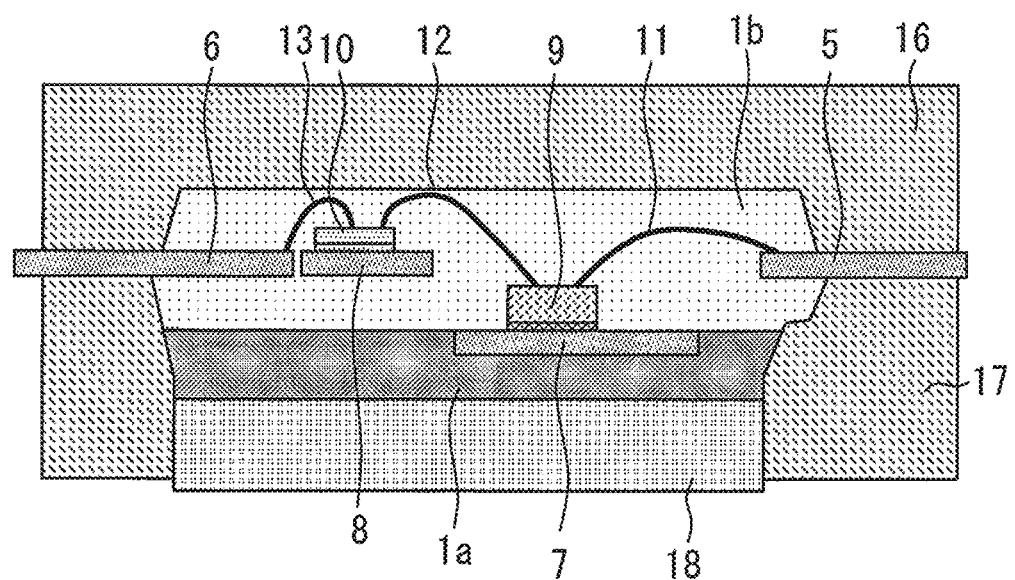
FIG. 27 is a cross-sectional view illustrating a manufacturing method for a power semiconductor apparatus according to a fourth embodiment of the present invention.

FIGS. 21 to 27 are cross-sectional views illustrating a manufacturing method for a power semiconductor apparatus according to a fourth embodiment of the present invention. FIGS. 21 to 26 are cross-sectional views of a region without the metal thin lines 11 to 13 and FIG. 27 is a cross-sectional view along the metal thin lines 11 to 13.

Figure 21:
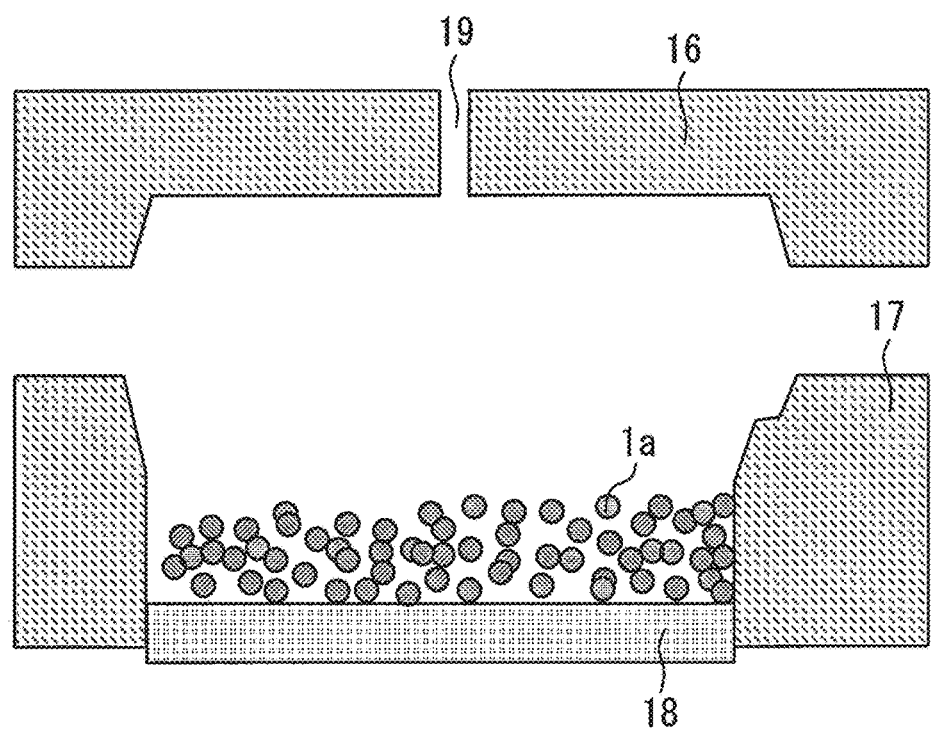
FIG. 21 is a cross-sectional view illustrating a manufacturing method for a power semiconductor apparatus according to a fourth embodiment of the present invention.

First, a resin sealing metal die composed of the upper metal die 16 and the lower metal die 17 is prepared as in the case of the first embodiment. Next, as shown in FIG. 21, the first sealing resin 1*a* is supplied onto the movable cavity 18 of the lower metal die 17.

Figure 22:
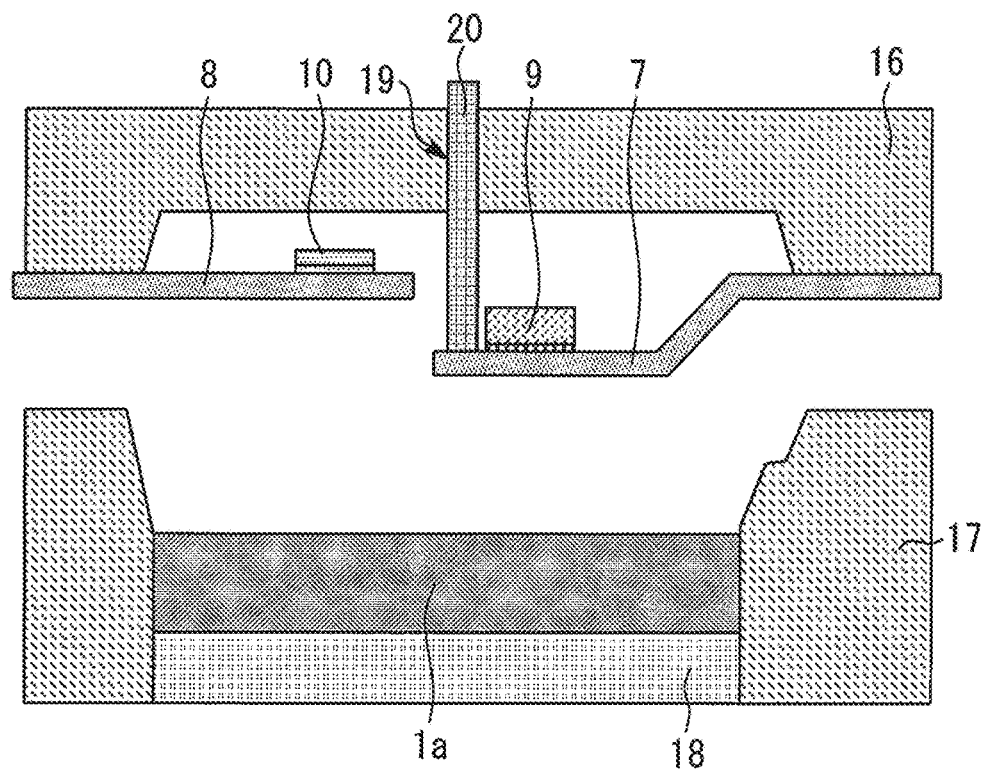
FIG. 22 is a cross-sectional view illustrating a manufacturing method for a power semiconductor apparatus according to a fourth embodiment of the present invention.

Next, as shown in FIG. 22, the lead frame 4 is fixed to the upper metal die 16 through vacuum suction or the like, the first metal die pin 20 is made to project out and come into contact with the upper surface of the power die pad 7. The power semiconductor device 9, the control semiconductor device 10 and the metal thin lines 11 to 13 are opposed to the upper metal die 16. The first sealing resin 1*a* is melted with heat from the lower metal die.

Figure 23:
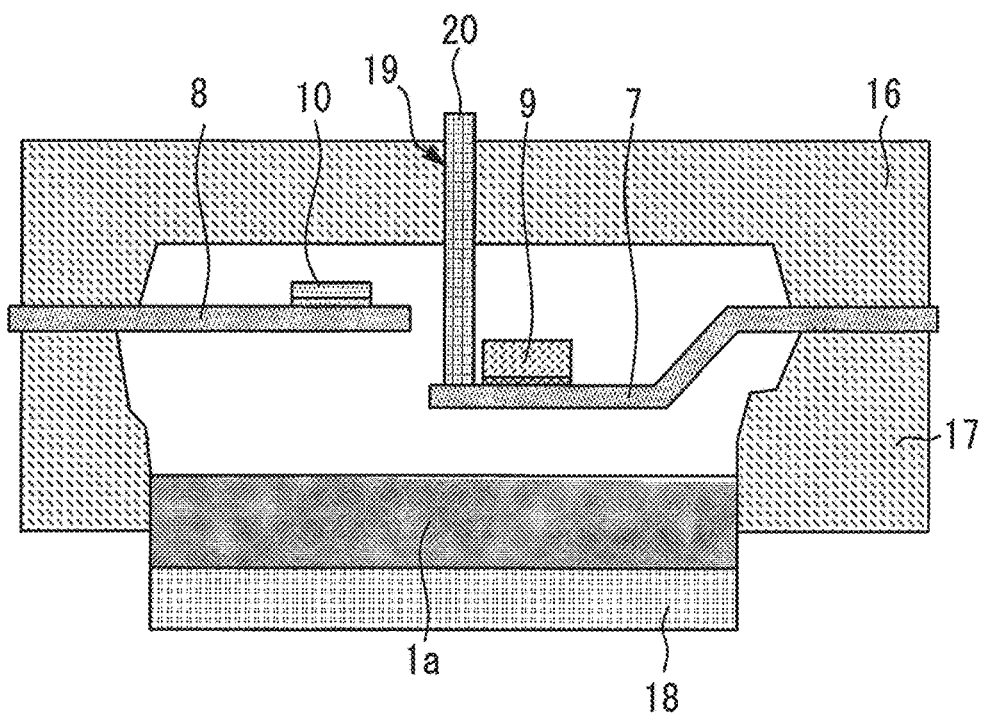
FIG. 23 is a cross-sectional view illustrating a manufacturing method for a power semiconductor apparatus according to a fourth embodiment of the present invention.

Next, as shown in FIG. 23, while the first sealing resin 1*a* is in a molten state, the metal die is closed with the upper metal die 16 and the lower metal die 17 sandwiching the lead frame 4. At this time, the power die pad 7 and the control die pad 8 are sunk into the molten first sealing resin 1*a*.

Figure 24:
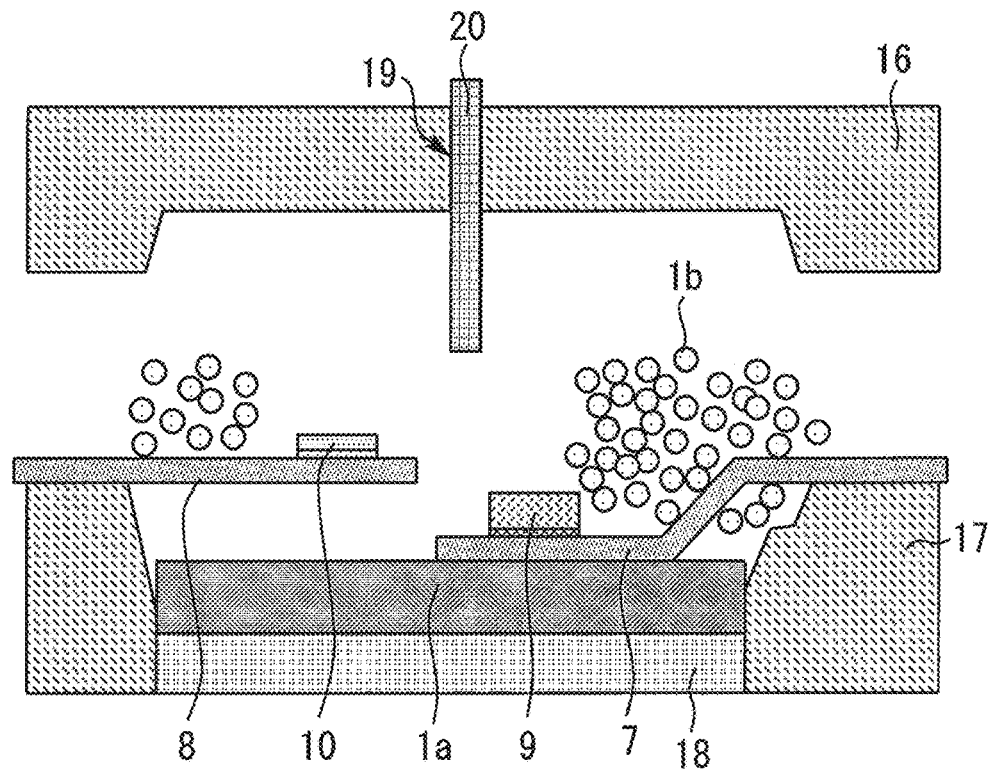
FIG. 24 is a cross-sectional view illustrating a manufacturing method for a power semiconductor apparatus according to a fourth embodiment of the present invention.

Next, as shown in FIG. 24, the upper metal die 16 is raised again, and while the lead frame 4 is positioned on the lower metal die 17, the second sealing resin 1*b* is supplied onto the lead frame 4. At this time, the second sealing resin 1*b* is spread in such a way as to avoid the metal thin lines 12 and 13 which are Au wires.

Next, as shown in FIG. 25, after lowering the upper metal die 16, the movable cavity 18 moves upward, pushing up the molten first and second sealing resin 1*a* and 1*b*. The second sealing resin 1*b* is left to fill up to the whole upper metal die 16. The first sealing resin 1*a* is provided up to the upper surface of the power die pad 7. However, the region above the power semiconductor device 9 is filled with the second sealing resin 1*b*.

Next, as shown in FIG. 26 and FIG. 27, the first metal die pin 20 is pulled out and a hydrostatic pressure is applied with the first and second sealing resin 1*a* and 1*b* melted by further pressurization. The first and second sealing resin 1*a* and 1*b* are left to cure within the resin sealing metal die to thereby form a sealing body and the sealing body is extracted from the resin sealing metal die. After that, the package outside shape and the outer leads are subjected to outline machining through an additional curing process such as post curing, and the power semiconductor apparatus according to the present embodiment is thereby completed.

In the present embodiment, the high heat conduction first sealing resin 1*a* is provided up to the upper surface of the power die pad 7. Thus, the side face and the upper surface of the power die pad 7 and the first sealing resin 1*a* can be mechanically fixed through an anchor effect. Moreover, since it is possible to increase bonding strength between the power die pad 7 and the sealing resin 1 without providing low thermal conductivity second sealing resin 1*b* on the under surface of the power die pad 7, it is possible to attain still higher heat dissipation of the insulating section 15. Furthermore, since the first sealing resin 1*a* is not provided above the upper surface of the power semiconductor device 9, it is possible to suppress deformation of the metal thin lines 11 to 13.

The distribution amounts of the first sealing resin 1*a* and the second sealing resin 1*b* can be changed within a range in which the first sealing resin 1*a* and the power die pad 7 can be mechanically fixed. For this reason, the amount of warp of the package can be controlled by adjusting the amount of the low stress second sealing resin 1*b* that relaxes stress. When the power semiconductor apparatus is mounted on an external substrate, if warp of the package is large, stress occurs between the lead frame 4 and the sealing resin 1, but it is possible to reduce stress when the substrate is mounted by adjusting the amount of the second sealing resin 1*b* and controlling the amount of warp. Therefore, reliability during actual use in substrate mounting improves.

Fifth Embodiment

Figure 28:
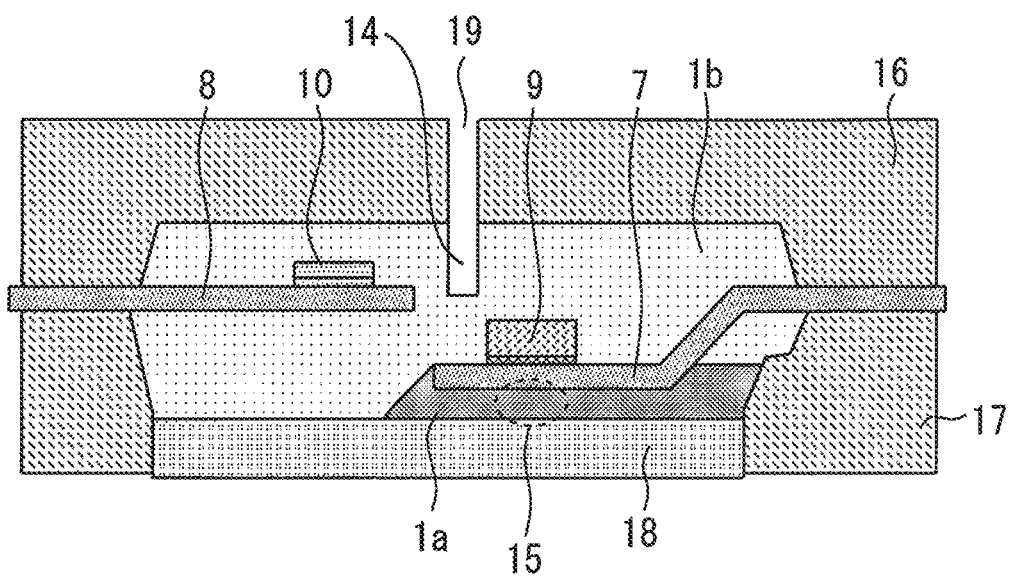
FIG. 28 is a cross-sectional view illustrating a power semiconductor apparatus according to a fifth embodiment of the present invention.

FIG. 28 is a cross-sectional view illustrating a power semiconductor apparatus according to a fifth embodiment of the present invention. The first sealing resin 1*a* having a high content concentration of inorganic particles is locally provided around the power die pad 7. Therefore, the concentration of inorganic particles included in the insulating section 15 is locally high on the under surface of the power die pad 7.

When high filler density sealing resin and low filler density sealing resin are collectively molded, the high density sealing resin is slightly spread over the whole sealing body. In contrast, when the first sealing resin 1a with a high content concentration is locally provided as in the case of the present embodiment, the sealing resin is less spread in the plane direction and the amount of spreading also decreases. When the substrate is mounted, stress between the different types of sealing resin is reduced, and it is thereby possible to further suppress deformation of the wire caused by the filler and secure reliability.

The power semiconductor device 9 is not limited to semiconductor chips formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor device 9 formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

REFERENCE SIGNS LIST 1 sealing resin; 1a first sealing resin; 1b second sealing resin; 2,3 outer lead, 4 lead frame; 5,6 inner lead; 7 power die pad; 8 control die pad; 9 power semiconductor device; 10 control semiconductor device; 11-13 metal thin line; 14 first hollow; 15 insulating section; 16 upper metal die; 17 lower metal die; 19 first sliding part; 20 first metal die pin; 22 second hollow; 23 second sliding part; 24 second metal die pin

The invention claimed is:

1. A power semiconductor apparatus comprising:
a lead frame including an inner lead, an outer lead connected to the inner lead, and a power die pad;
a power semiconductor device bonded onto the power die pad;
a first metal thin line electrically connecting the inner lead and the power semiconductor device; and
sealing resin sealing the inner lead, the power die pad, the power semiconductor device, and the first metal thin line,
wherein the sealing resin includes an insulating section directly beneath the power die pad,
a thickness of the insulating section is 1 to 4 times a maximum particle diameter of inorganic particles in the sealing resin,
a first hollow is provided on an upper surface of the sealing resin directly above the power die pad in a region without the first metal thin line and the power semiconductor device,
the sealing resin includes first sealing resin and second sealing resin supplied onto the first sealing resin and having a lower concentration of inorganic particles than the first sealing resin,
the first sealing resin is provided up to an upper surface of the power die pad and is not provided above an upper surface of the power semiconductor device, and
the second sealing resin is in direct contact with the upper surface of the power die pad.

2. The power semiconductor apparatus according to claim 1, comprising:
a control semiconductor device controlling the power semiconductor device; and
a second metal thin line electrically connecting the power semiconductor device and the control semiconductor device,
wherein the lead frame includes a control die pad,
the control semiconductor device is bonded to the control die pad, and
the first hollow is provided in a region without the second metal thin line on the control die pad side with respect to the power semiconductor device.

3. The power semiconductor apparatus according to claim 2, wherein a second hollow is provided on the upper surface of the sealing resin directly above the control die pad in a region without the second metal thin line and the control semiconductor device.

4. The power semiconductor apparatus according to claim 1, wherein the second sealing resin comes into contact with an under surface of an inner lead.

5. The power semiconductor apparatus according to claim 1, wherein the first sealing resin is locally provided around the power die pad.

6. The power semiconductor apparatus of claim 1, wherein the second sealing resin fills a region above the power semiconductor device.

7. The power semiconductor apparatus of claim 1, further comprising:
a control die pad, and
a control semiconductor device controlling the power semiconductor device and bonded to the control die pad,
wherein a second hollow is provided on the upper surface of the sealing resin directly above the control die pad on a power die pad side with respect to the control semiconductor device.

8. The power semiconductor apparatus of claim 1, wherein the first sealing resin is provided only up to the upper surface of the power die pad.

9. The power semiconductor apparatus of claim 1, wherein the sealing resin consists of the first sealing resin and the second sealing resin.

10. The power semiconductor apparatus of claim 1, wherein the lead frame further includes a control die pad that is disposed in the second sealing resin.

11. A manufacturing method for a power semiconductor apparatus comprising:
preparing a lead frame including an inner lead, an outer lead connected to the inner lead, and a power die pad;
bonding a power semiconductor device onto the power die pad;
electrically connecting the inner lead and the power semiconductor device via a first metal thin line;
making a first metal die pin to project out from a first sliding part of an upper metal die to come into contact with an upper surface of the power die pad, sandwiching the lead frame by the upper metal die and a lower metal die, filling an insulating section directly beneath the power die pad and the upper metal die with sealing resin from an under surface of the power die pad through compression molding to seal the inner lead, the power die pad, the power semiconductor device and the first metal thin line; and pulling out the first metal die pin, deaerating a volatile content existing between the upper metal die and the lower metal die through the first sliding part, and curing the sealing resin, wherein first sealing resin and second sealing resin are supplied as the sealing resin, the second sealing resin being supplied onto the first sealing resin and having a lower concentration of inorganic particles than the first sealing resin, the first sealing resin is provided up to the upper surface of the power die pad and is not provided above an upper surface of the power semiconductor device, and the second sealing resin is in direct contact with the upper surface of the power die pad.

12. The manufacturing method for a power semiconductor apparatus according to claim 11, comprising:

bonding a control semiconductor device controlling the power semiconductor device to a control die pad of the lead frame; and electrically connecting the power semiconductor device and the control semiconductor device via a second metal thin line, wherein the first metal die pin is made to come into contact with an upper surface of the power die pad on the control die pad side with respect to the power semiconductor device.

13. The manufacturing method for a power semiconductor apparatus according to claim 12, wherein a second metal die pin is made to project out from a second sliding part of the upper metal die, while keeping the second metal die pin in contact with an upper surface of the control die pad, sealing is performed using the sealing resin, and the second metal die pin is pulled out and the sealing resin is left to cure.

14. The manufacturing method for a power semiconductor apparatus according to claim 11, wherein the first sealing resin is supplied onto the lower metal die, and while the lead frame is positioned on the lower metal die, the second sealing resin is supplied.

15. The manufacturing method according to claim 11, further comprising: filling a region above the power semiconductor device with the second sealing resin.

16. The manufacturing method of claim 11, wherein
the lead frame further includes a control die pad,
the manufacturing method further comprises:
bonding a control semiconductor device controlling the power semiconductor device onto the control die pad, and
the making includes making a second metal die pin to project out from a second sliding part of the upper metal die to come into contact with an upper surface of the control die pad on a power die pad side with respect to the control semiconductor device.

17. The manufacturing method of claim 11, wherein the first sealing resin is provided only up to the upper surface of the power die pad.

18. The manufacturing method of claim 11, wherein the sealing resin consists of the first sealing resin and the second sealing resin.

19. The manufacturing method of claim 11, wherein the lead frame further includes a control die pad that is disposed in the second sealing resin.

* * * * *